United States Patent
Jaladanki et al.

(10) Patent No.: US 12,431,783 B2
(45) Date of Patent: Sep. 30, 2025

(54) RDSON-BASED CURRENT SENSING SYSTEM

(71) Applicant: TEXAS INSTRUMENTS INCORPORATED, Dallas, TX (US)

(72) Inventors: Vishnuvardhan Reddy Jaladanki, Secunderabad (IN); Preetam Charan Anand Tadeparthy, Bengaluru (IN); Scott Ragona, Bethlehem, PA (US); Rengang Chen, Center Valley, PA (US); Evan Michael Reutzel, Center Valle, PA (US); Bhaskar Ramachandran, Coimbatore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/593,557

(22) Filed: Mar. 1, 2024

(65) Prior Publication Data

US 2025/0279712 A1    Sep. 4, 2025

Related U.S. Application Data

(63) Continuation of application No. 17/678,220, filed on Feb. 23, 2022, now Pat. No. 11,949,320.

(60) Provisional application No. 63/152,702, filed on Feb. 23, 2021.

(51) Int. Cl.
  H02M 3/158 (2006.01)
  H02M 1/00 (2006.01)

(52) U.S. Cl.
  CPC ........ *H02M 1/0009* (2021.05); *H02M 3/158* (2013.01)

(58) Field of Classification Search
  CPC ........................... H02M 1/0009; H02M 3/158
  See application file for complete search history.

(56) References Cited

U.S. PATENT DOCUMENTS

| | | |
|---|---|---|
| 8,072,200 B1 | 12/2011 | Qiu |
| 2010/0277142 A1 | 11/2010 | Tan |
| 2018/0226892 A1* | 8/2018 | Ragona ............... H02M 3/1588 |
| 2020/0076303 A1 | 3/2020 | Sarkka |
| 2020/0144915 A1* | 5/2020 | Mei ........................ H02M 1/32 |
| 2020/0292586 A1 | 9/2020 | Loccia |
| 2021/0067148 A1* | 3/2021 | Bertolini ............... H02M 3/158 |
| 2022/0173657 A1* | 6/2022 | Ramorini ............ H02M 1/0009 |

\* cited by examiner

*Primary Examiner* — Alex Torres-Rivera
(74) *Attorney, Agent, or Firm* — Valerie M. Davis; Frank D. Cimino (57) ABSTRACT

An apparatus includes a first variable resistor having a first resistor control terminal and a second variable resistor having a second resistor control terminal. The apparatus also includes a temperature sensing circuit having a temperature sensing output, the temperature sensing circuit configured to provide a device temperature indication at the temperature sensing output. Additionally, the apparatus includes a controller having a controller input, a controller output, the controller input coupled to the temperature sensing output, the controller output coupled to the first resistor control terminal and to the second resistor control terminal, the controller configured to produce a control signal at the controller output responsive to the device temperature indication.

20 Claims, 6 Drawing Sheets

RDSON-BASED CURRENT SENSING SYSTEM

CROSS-REFERENCE TO RELATED APPLICATIONS

This application is a continuation of U.S. patent application Ser. No. 17/678,220 filed Feb. 23, 2022, which also claims priority to U.S. Provisional Application No. 63/152,702, filed Feb. 23, 2021, which Applications are hereby incorporated herein by reference in their entireties.

BACKGROUND

In many DC/DC converters, the output current is monitored to protect inductors of the DC/DC converter, to determine loading on the DC/DC converter, and to calculate the efficiency of the DC/DC converter. In multiphase converters, multiple inductors drive the same capacitor, and the current of each phase of the converter is monitored to ensure the current is shared equally between the different available phases.

SUMMARY

An apparatus includes a switch, a first current path, a second current path, a current mirror, first and second buffers, and a third variable resistor. The switch has a first terminal coupled to an output of the first current path and a second terminal configured to switch between a ground terminal or a low-side power transistor based on a control signal. The second current path has a current path output coupled to the ground terminal. The input of the first current path is coupled to an input of the current mirror, and the input of the second current path is coupled to a first output of the current mirror. Each of the first and second current paths includes: a respective transistor; a respective differential amplifier; and a respective variable resistor. The transistor has a control terminal, a first current terminal coupled to the input of the particular current path, and a second current terminal.

The differential amplifier has a positive input, a negative input coupled to the second current terminal, and an output coupled to the control terminal. The variable resistor is coupled between the negative input and the output of the particular current path. A second output of the current mirror is coupled to an input of the first buffer, which has an output. The second buffer has an input and an output, and the third variable resistor is coupled between the output of the second buffer and the input of the first buffer.

In some implementations, a gain stage is coupled between the second output of the current mirror and the input of the first buffer. The apparatus can also include an operational transconductance amplifier (OTA) and a capacitor. The OTA has a positive input coupled to the output of the second buffer, a negative input coupled to the output of the first buffer, and an output. The capacitor is coupled between the output of the OTA and the ground terminal, and the positive input of the differential amplifier in the first current path is coupled to the output of the OTA.

The apparatus can include a controller configured to set the output of the first buffer and the output of the second buffer to be equal at intervals, in some implementations. The controller can also adjust a resistance of the first, second and third variable resistors. The apparatus can further include a temperature sensing circuit and an analog-to-digital converter (ADC) in some implementations. The temperature sensing circuit measures a temperature of the apparatus, and the ADC converts an analog temperature signal from the temperature sensing circuit into a digital temperature signal. The controller adjusts the resistance of the first, second and third variable resistors based on the digital temperature signal.

In some implementations, the controller determines a variation in drain-source on resistance (Rdson) of the low-side power transistor over temperature and determines a first adjustment to the resistance of the first, second and third variable resistors for a first temperature range, and a second adjustment to the resistance of the first, second and third variable resistors for a second temperature range. For the first temperature range, the controller increases the resistance of the third variable resistor relative to the resistance of the first and second variable resistors. For the second temperature range, the controller increases the resistance of the first and second variable resistors relative to the resistance of the third variable resistor.

In some implementations, the controller is configured to adjust the resistance of the first, second and third variable resistors based on a variation in drain-source on resistance (Rdson) of the low-side power transistor.

DETAILED DESCRIPTION

The same reference number is used in the drawings for the same or similar (either by function and/or structure) features. The described Rdson-based current sensing systems include a switch, first and second current paths, a current mirror, first and second buffers, and a variable resistor. The current mirror has first, second and third outputs; the first current path is coupled to the first output and to the switch, and the second current path is coupled to the second output and to ground. The third output is coupled to the first buffer. The switch switches between ground and a low-side power transistor based on a control signal.

Each of the first and second current paths includes a respective transistor, a respective differential amplifier, and a respective variable resistor. The transistor has a first current terminal coupled to the first current mirror output, a second current terminal, and a control terminal. The differential amplifier has a positive input at which the differential amplifier is configured to receive a first reference voltage, a negative input coupled to the second current terminal, and an output coupled to the control terminal. The variable resistor is coupled between the negative input and the output of the current path.

The second buffer receives a second reference voltage, and the third variable resistor is coupled between the second buffer and the first buffer. In some implementations, a gain stage is coupled between the third output of the current mirror and the first buffer. An operational transconductance amplifier (OTA): (a) receives voltages at the outputs of the first and second buffers; and (b) in an auto-zeroing mode of operation implemented at intervals, integrates the difference onto a capacitor coupled between the positive input of the differential amplifier in the first current path and the ground terminal.

Figure 1A:
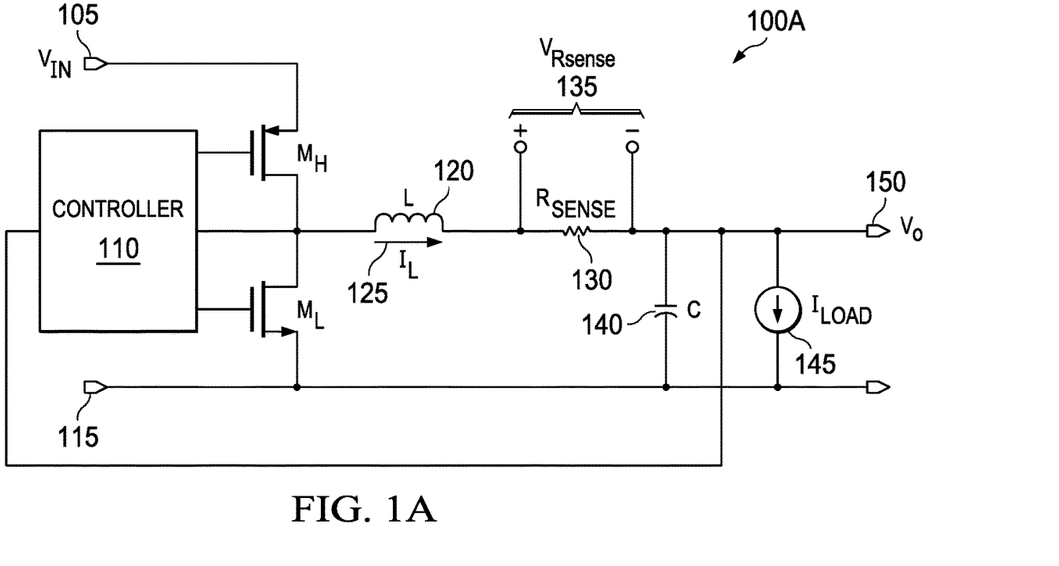
FIG. 1A shows an example DC/DC buck converter having a current-sensing resistor.

FIG. 1A shows an example DC/DC buck converter 100A having a current-sensing resistor Rsense 130. The DC/DC buck converter 100A includes a controller 110, a high-side power transistor MH, a low-side power transistor ML, an inductor L 120, a capacitor C 140, and a current source Iload 145, which represents the current through the load of the DC/DC buck converter 100A. The high-side transistor MH and the low-side transistor ML are field-effect transistors (FETs). MH is a p-channel FET (PFET), and ML is an n-channel FET (NFET) in this example. In other examples, MH is an NFET, ML is a PFET, and/or one or both of MH and ML are bipolar junction transistors (BJTs). A BJT includes a base corresponding to the gate terminal, and a collector and an emitter corresponding to the drain and source terminals of a FET. The base of a BJT and the gate terminal of a FET are also called control inputs. The collector and emitter of a BJT and the drain and source terminals of a FET are also called current terminals.

MH is configured to receive an input voltage Vin 105 at its source terminal, and the drain terminal of MH is coupled to the drain terminal of ML. The source terminal of ML is coupled to ground 115. The gate terminals of MH and ML are coupled to controller 110. The inductor L 120 is coupled to the drain terminals of MH and ML and to the current-sensing resistor Rsense 130. The current IL 125 through the inductor L 120 is determined based on a voltage Vrsense 135 across Rsense 130, which is further coupled to the output voltage terminal Vo 150. The capacitor C 140 is coupled to the terminal Vo 150 and to ground 115. The current source Iload 145 is coupled between the terminal Vo 150 and ground 115. The controller is further coupled to the output voltage terminal Vo 150.

While the current-sensing resistor Rsense 130 enables accurate measurement of the current IL 125, Rsense 130 introduces a power loss that may be represented as:

$$\text{Power loss} = (\text{IL } 125)^2 (\text{Rsense } 130) \quad (1)$$

For high power, high current, high load applications, the power loss can become prohibitive. Also, measuring the voltage Vrsense 135 requires two pins, and may be difficult to scale to multiphase DC/DC buck converters.

Figure 1B:
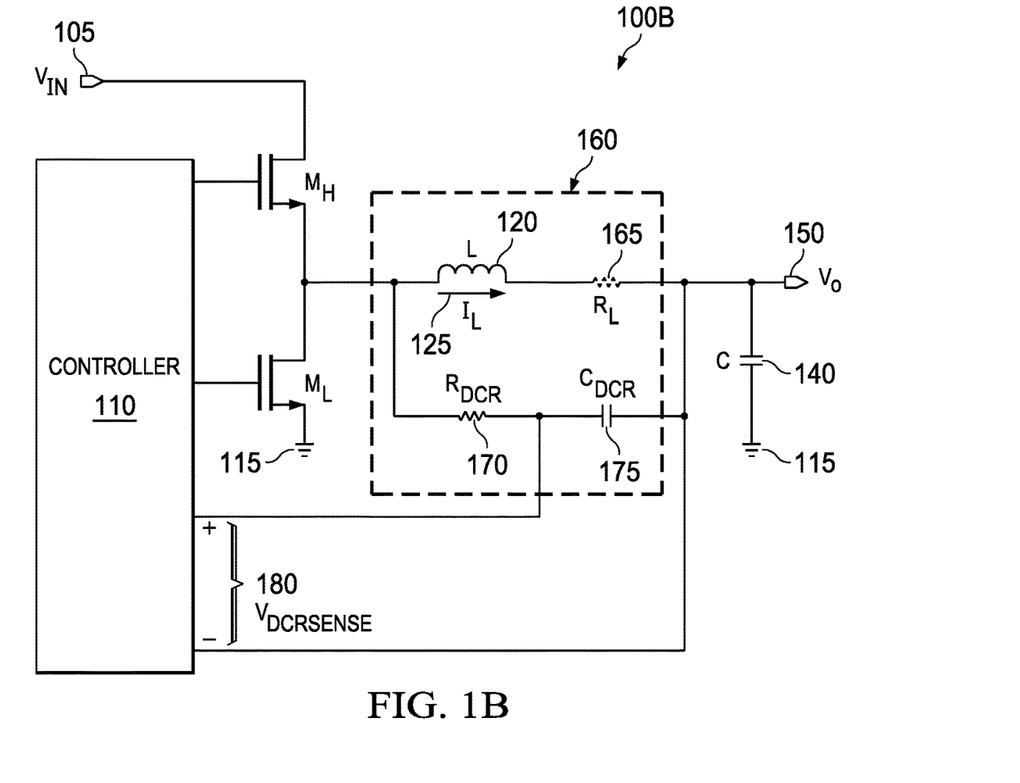
FIG. 1B shows an example DC/DC buck converter having inductor DC resistance current sensing.

FIG. 1B shows an example DC/DC buck converter 1001B with inductor DC resistance (DCR) current sensing. The DC/DC buck converter 1001B is similar to the DC/DC buck converter 100A of FIG. 1A, but omits the current-sensing resistor Rsense 130 and includes a resistor RL 165 that is representative of the DCR of the inductor L 120, a resistor Rdcr 170, and a capacitor Cdcr 175. The resistor RL 165 is coupled in series between the inductor L 120 and the output voltage terminal Vo 150. The resistor Rdcr 170 is coupled to the drain terminals of MH and ML and the inductor L 120, and to the capacitor Cdcr 175, which is further coupled to the output voltage terminal Vo 150.

The time constants are selected to make the product of Rdcr 170 and Cdcr 175 proportional to the ratio of the inductance of inductor L 120 to the resistor RL 165, which may be represented as:

$$(\text{Rdcr } 170)(\text{Cdcr } 175) = \frac{L\ 120}{RL\ 165} \quad (2)$$

The voltage Vdcrsense 180 across the capacitor Cdcr 175 is then proportional to the current IL 125 through inductor L 120:

$$\text{Vdcrsense } 180 = (\text{IL } 125)(\text{RL } 165) \quad (3)$$

The DCR-based sensing technique in the DC/DC buck converter 100B is more efficient than the current-sensing resistor Rsense 130 of FIG. 1A, but the values of Rdcr 170 and Cdcr 175 must be selected to make the time constants matched. The voltage Vdcrsense 180 can experience very low signal swing, as the resistance RL 165 is selected to be very small to reduce the voltage drop across it. Also, measuring the voltage Vdcrsense 180 uses two pins, and may be difficult to scale for multiphase DC/DC buck converters.

Figure 1C:
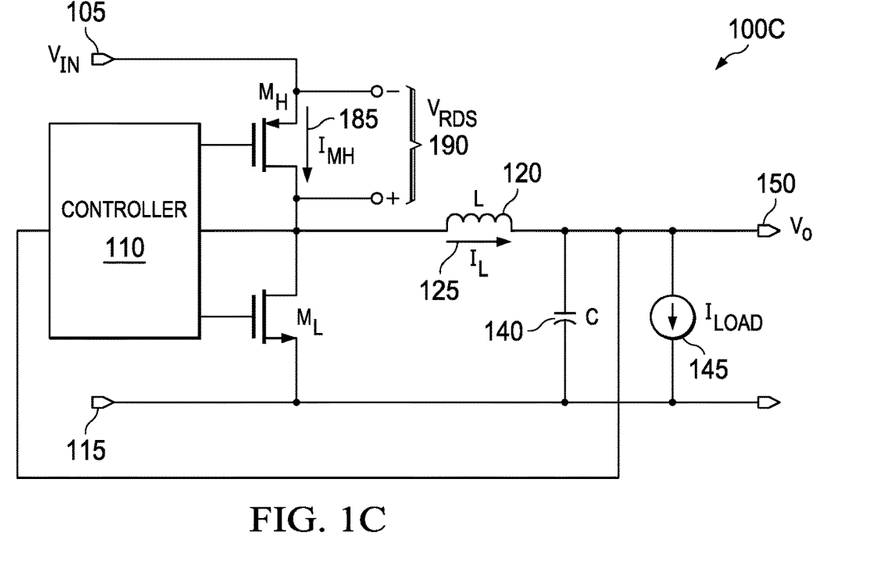
FIG. 1C shows an example DC/DC buck converter having drain-source on-resistance (Rdson) current sensing.

FIG. 1C shows an example DC/DC buck converter 100C with drain-source on-resistance (Rdson) current sensing. The DC/DC buck converter 100C is similar to the DC/DC buck converter 100A of FIG. 1A, but omits the current-sensing resistor Rsense 130. In Rdson current sensing, the voltage Vrds 190 across the high-side power transistor MH or across the low-side power transistor ML is measured. In this example, the voltage Vrds 190 is measured across the transistor MH, and the Vrds 190 is used to determine the current IMH 185 through the transistor and the current IL 125 through the inductor L 120.

Figure 1D:
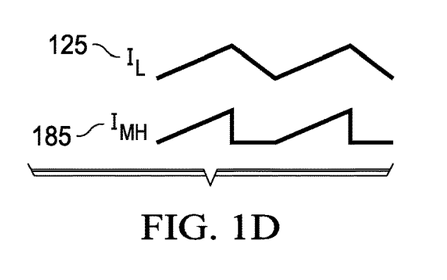
FIG. 1D shows waveforms of currents in the DC/DC buck converter having drain-source on-resistance current sensing of FIG. 1C.

FIG. 1D shows waveforms of the current IMH 185 through the transistor MH and the current IL 125 through the inductor L 120 in the DC/DC buck converter 100C of FIG. 1C. The current IMH 185 is useful to determine the rising edge of IL 125. For a Vrds 190 measured across the low-side transistor ML, the current IML through the transistor ML is useful to determine the falling edge of IL 125. Using the input voltage Vin 105, the output voltage Vo 150, the inductance of inductor L 120, and either of IMH 185 and IML, both the rising and falling edges of IL 125 can be reconstructed.

The Rdson current sensing technique relies on a single pin to measure the voltage Vrds 190 across either the high-side transistor MH or the low-side transistor ML, which can be scaled to multiphase DC/DC buck converters. However, variations in temperature and supply voltage impact the value of Rdson, resulting in inaccurate current sensing. However, a front-end Vrds 190 voltage-sensing circuit for the low-side transistor ML can compensate for variations in temperature and supply voltage.

Figure 2:
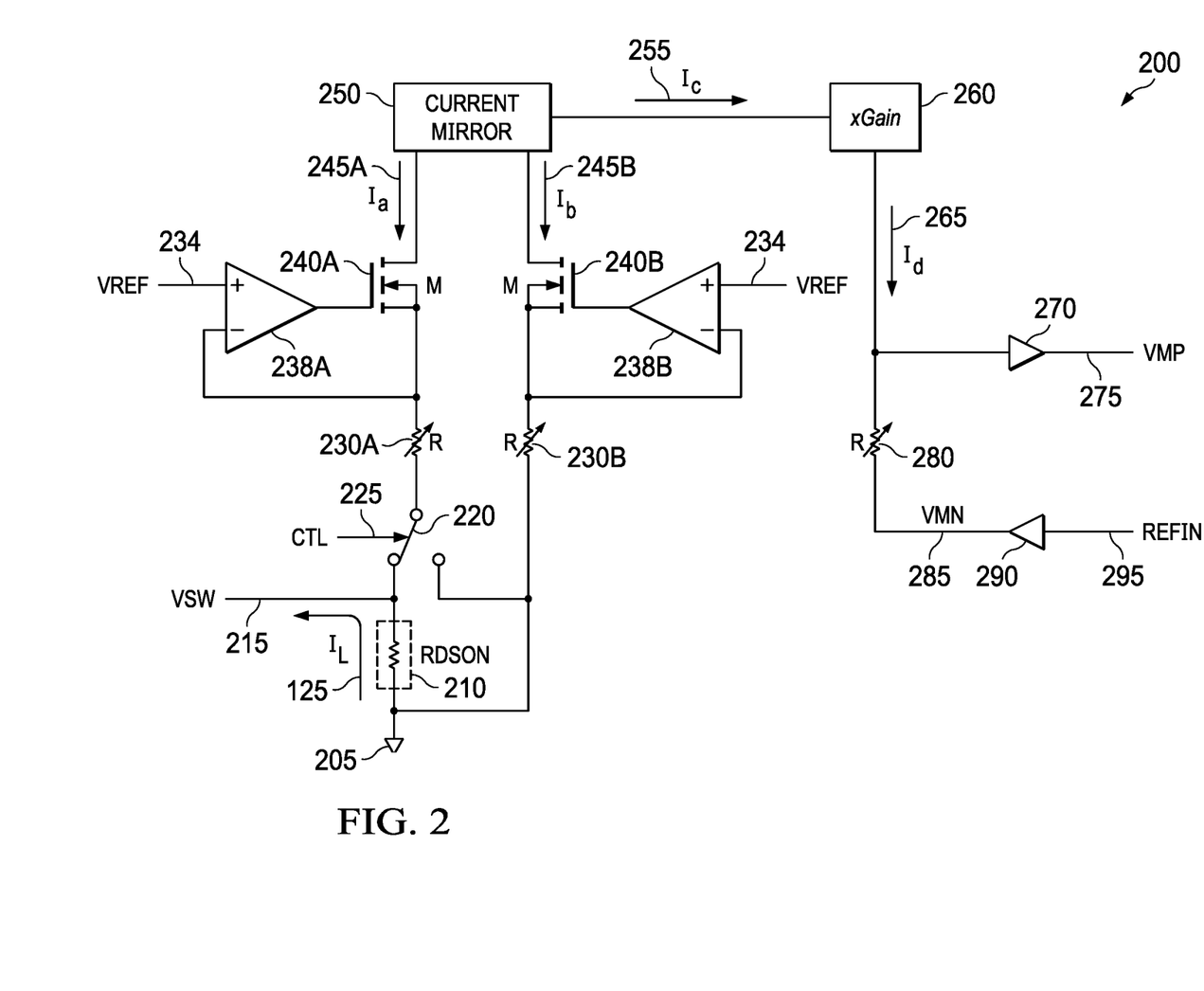
FIG. 2 shows an example Rdson current sensing circuit.

FIG. 2 shows an example front-end Rdson current-sensing circuit 200 for a low-side power transistor represented as the resistor Rdson 210. The current-sensing circuit 200 is described herein with respect to the DC/DC buck converters 100C of FIG. 1C. The current-sensing circuit 200 includes a switch 220, variable resistors R 230A-B and 280, differential amplifiers 238A-B, transistors M 240A-B, the current mirror 250, an optional gain stage 260, and buffers 270 and 290. The transistors M 240A-B are NFETs in this example. But in other implementations, one or more of M 240A-B are PFET(s) and/or BJT(s).

The low-side power transistor represented by Rdson 210 is coupled to ground 205. The voltage VSW 215 is measured across Rdson 210, and the current IL 125 through the inductor L 120 flows through Rdson 210 while ML is turned on. The variable resistor R 230A is coupled to the negative input of the differential amplifier 238A and to the source terminal of M 240A and to the switch 220, which couples variable R 230A to ground 205 or Rdson 210 based on the control signal CTL 225. The control signal CTL 225 causes R 230A to be coupled to ground 205 while ML is turned off and to Rdson 210 while ML is turned on. The differential amplifier 238A is configured to receive a reference voltage Vref 234 at its positive input, and the output of the differential amplifier 238A is coupled to the gate terminal of M 240A. The current Ia 245A through the transistor M 240A is generated based on the reference voltage Vref 234 and the resistance from the negative input of the amplifier 238A to ground 205, including the resistor R 230A and Rdson 210. The drain terminal of M 240A is coupled to an input of the current mirror 250. The current mirror 250 mirrors the input current Ia 245A and provides it as the current Ib 245B.

The variable resistor R 230B is coupled to the negative input of the differential amplifier 238B and to the source terminal of M 240B and to ground 205. The differential amplifier 238B is configured to receive Vref 234 at its positive input, and the output of the differential amplifier 238B is coupled to the gate terminal of M 240B. The drain terminal of M 240B receives the current Ib 245B from the current mirror 250. The current mirror provides a current Ic 255 to the optional gain stage 260. The current Ic 255 can be represented as:

$$Ic\ 255 = Ia\ 245A - Ib\ 245B \tag{4}$$

The optional gain stage 260 provides a current Id 265, which can be represented as:

$$Id\ 265 = G(Ic\ 255) = G(Ia\ 245A - Ib\ 245B) \tag{5}$$

where G represents the gain of gain stage 260. The current Id 265 is provided to the variable resistor R 280, which is coupled between the output of the optional gain stage 260 and the output of the buffer 290. The buffer 290 is configured to: receive a reference voltage REFIN 295, which sets the common mode voltage; and provide the voltage VMN 285 to one terminal of the variable resistor R 280. The voltage at the other terminal of the variable resistor R 280 is based on the voltage VMN 285 and the current Id 265, and is provided to the input of buffer 270, which provides the voltage VMP 275.

The voltage VMP 275 is a voltage equivalent to the inductor current IL 125, and may be represented as:

$$VMP\ 275 = Vref\ 234 + (IL\ 125)(G) \tag{6}$$

where Vref 234 represents a common mode or offset voltage, and the gain G is expressed as volts per ampere (V/A). While the low-side transistor ML is turned on, the voltage VSW 215 may be represented as:

$$VSW\ 215 = (Rdson\ 210)(-IL\ 125) \tag{7}$$

The current Ia 245A through the resistor R 230A may be represented as:

$$Ia\ 245A = \frac{Vref\ 234 - VSW\ 215}{R\ 230A} \tag{8}$$

The current Ib 245B through the resistor R 230B may be represented as:

$$Ib\ 245B = \frac{Vref\ 234}{R\ 230B} \tag{9}$$

The output voltage VMP 275 can be rewritten as:

$$VMP\ 275 = \left(\frac{Vref\ 234 - VSW\ 215}{R\ 230A} - \frac{Vref\ 234}{R\ 230B}\right)(G)(R\ 280) + VMN\ 285 \tag{10}$$

By choosing the resistances of R 230A and R 230B to be equal, the output voltage VMP 275 can be simplified to:

$$VMP\ 275 = \left(-\frac{VSW\ 215}{R\ 230A}\right)(G)(R\ 280) + VMN\ 285 \tag{11}$$

Substituting in the definition of VSW 215, the output voltage VMP 275 can be represented as:

$$VMP\ 275 = \left(\frac{(IL\ 125)(Rdson\ 210)(G)(R\ 280)}{R\ 230A}\right) + VMN\ 285 \tag{12}$$

As a result, the common mode voltage at zero current can be set using VMN 285 and by extension, REFIN 295. Variations in the value of Rdson 210 can be compensated by varying the ratio of the resistance of R 280 to the resistance of R 230A, which is equal to the resistance of R 230B. In one example, when the current-sensing circuit 200 is used for high bandwidth applications, the resistances of R 230A and R 230B are fixed, and the resistance of R 280 is varied. In another example, the resistances of R 230A and R 230B are varied, and the resistance of R 280 is fixed, when the current-sensing circuit 200 is used for high bandwidth applications. The gain can be adjusted using the optional gain stage 260. However, the differential amplifier offsets, inaccuracies in the current mirror 250, and the like can introduce inaccuracy into the output voltage VMP 275 and by extension the calculations of IL 125.

Figure 3:
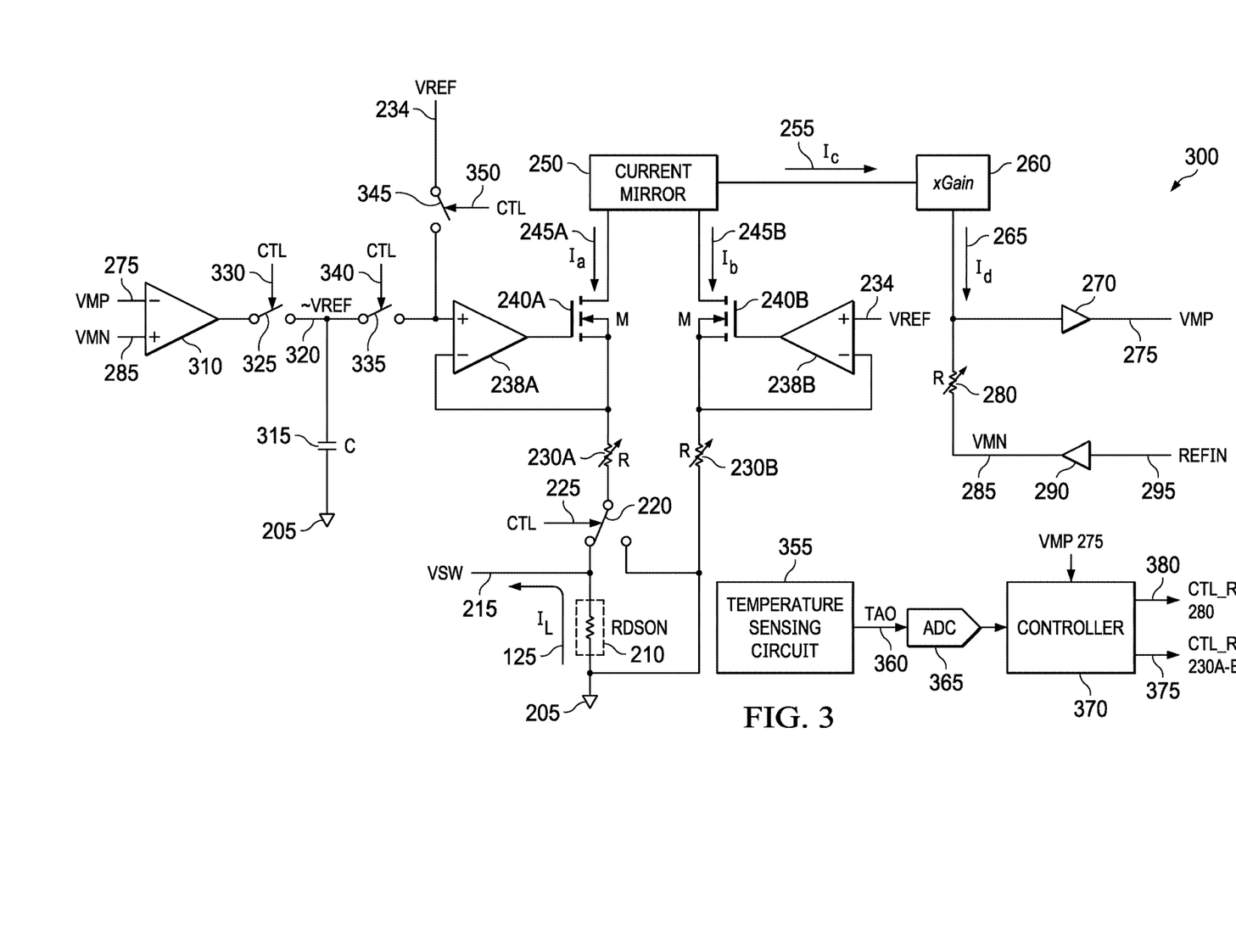
FIG. 3 shows the example Rdson current sensing circuit of FIG. 2 having error correction.

Ideally for zero current, VMP 275 is equal to VMN 285, so forcing VMP 275 to be equal to VMN 285 at intervals is useful to compensate for nonidealities in the current sensing circuit 200. The error between VMP 275 and VMN 285 is integrated and used as a reference for the differential amplifier 238A, and any error between VMP 275 and VMN 285 for zero load current will be adjusted. FIG. 3 shows an example Rdson current sensing circuit 300 with error correction. The Rdson current sensing circuit 300 is similar to the Rdson current sensing circuit 200 of FIG. 2, but also includes: an operational transconductance amplifier (OTA) 310; a capacitor 315; switches 325, 335 and 345; a temperature sensing circuit 355; an analog-to-digital converter (ADC) 365; and a controller 370.

The OTA 310 has: (a) a positive input at which the OTA 310 is configured to receive VMN 285; and (b) a negative input at which the OTA 310 is configured to receive VMP 275. The output of OTA 310 is coupled to switch 325, which opens and closes based on the control signal CTL 330. The switch 325 couples the output of OTA 310 to a terminal of the capacitor C 315. The capacitor 315 is further coupled to ground 205. The switch 335 couples the terminal of capacitor C 315 to the positive input of differential amplifier 238A based on the control signal CTL 340. The controller 370 may generate the control signals 330, 340 and 350 for switches 325, 335 and 345, respectively, so autozeroing is performed at intervals.

During autozeroing: (a) the switch 335 opens, thereby disconnecting the capacitor C 315 from the positive input of differential amplifier 238A; and (b) the switch 325 closes, thereby connecting the capacitor C 315 to the output of the OTA 310. The output of OTA 310 provides a current to the capacitor C 315, which stores the value of the error between VMP 275 and VMN 285 as a corrected reference voltage ~Vref 320. The corrected reference voltage ~Vref 320 compensates for errors introduced by the differential amplifier offsets, inaccuracies in the current mirror 250, and the like. The capacitance of C 315 and the length of time between autozeroing can be selected to prevent error leakage.

While the switch 335 is open and the corrected reference voltage ~Vref 320 across the capacitor C 315 is disconnected from the positive input of differential amplifier 238A, the control signal CTL 350 causes switch 345 to be closed, and the positive input of the differential amplifier 238A receives the reference voltage Vref 234. After the autozeroing has been completed, the switch 345 is opened, thereby disconnecting the reference voltage Vref 234 from the positive input of the differential amplifier 238A. The switch 325 is opened, thereby disconnecting C 315 from the output of OTA 310. Also, the switch 335 is closed, thereby connecting C 315 to the positive input of the differential amplifier 238A and providing the corrected reference voltage ~Vref 320 across the capacitor C 315 to it. The controller 370 receives the output voltage VMP 275 and reconstructs the current IL 125 through the inductor L 120 based on VMP 275.

Although errors introduced by the current sensing circuit 300 are corrected, variations in Rdson 210 based on temperature and supply voltage can still result in inaccurate current sensing. However, the variation of Rdson 210 with respect to temperature is a known characteristic of the transistor ML, and so the ratio of the resistance of R 280 to the resistance of R 230A can be adjusted to compensate for the temperature variations in Rdson 210 using the control signals CTL_R 230A-B 375 and CTL_R 280 380 from controller 370.

Ignoring the common mode term VMN 285, VMP 275 can be represented as:

$$VMP\ 275 = \left( \frac{(IL\ 125)(Rdson\ 210)(G)(R\ 280)\left(\frac{Rdson\_roomtemp}{Rdson\_roomtemp}\right)}{R\ 230A} \right) \quad (13)$$

where Rdson_roomtemp represents the impedance of the low-side transistor ML at room temperature. The normalized value Rdson_norm of Rdson 210 with respect to room temperature can be represented as:

$$Rdson\_norm = \frac{Rdson\ 210}{Rdson\_roomtemp} \quad (14)$$

Substituting the normalized Rdson_norm into equation (13), VMP 275 can be represented as:

$$VMP\ 275 = \left( \frac{(IL\ 125)(Rdson\_roomtemp)(Rdson\_norm)(G)(R\ 280)}{R\ 230A} \right) \quad (15)$$

As equation 15 illustrates, Rdson_norm varies with respect to temperature, and the ratio of the resistance of R 280 to the resistance of R 230A can be adjusted to make the product of Rdson_norm and (R 280/R 230A) remain constant with respect to temperature. The effective VMP 275 can be represented as:

$$VMP\ 275 = (IL\ 125)(Rdson\_roomtemp)(G\_effective) \quad (16)$$

where G_effective can be represented as:

$$G\_effective = (G)\left(\frac{R\ 280}{R\ 230A}\right)(Rdson\_norm) \quad (17)$$

To determine how to adjust the resistances of R 230A-B and R 280, the variation of Rdson 210 with respect to temperature is measured. In one example, when the current-sensing circuit 200 is used for high bandwidth applications, the resistances of R 230A and R 230B are fixed, and the resistance of R 280 is varied. In another example, the resistances of R 230A and R 230B are varied, and the resistance of R 280 is fixed, when the current-sensing circuit 200 is used for high bandwidth applications.

Figure 4:
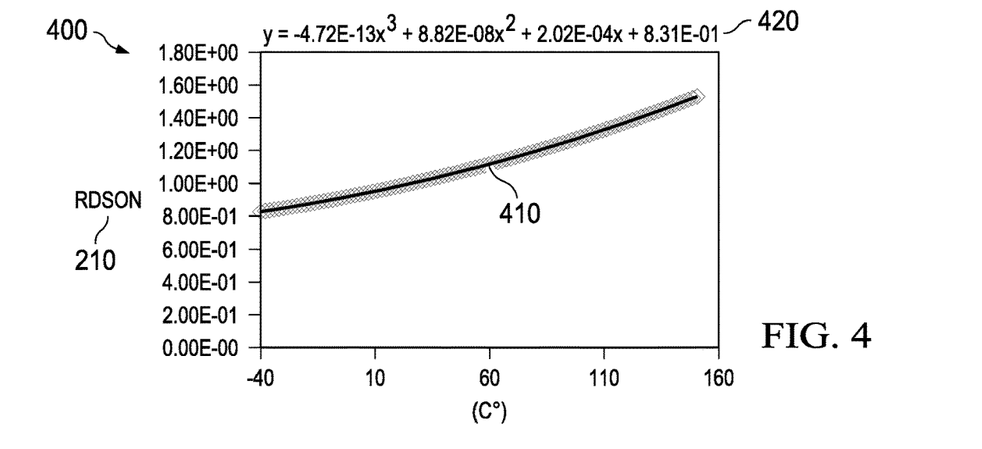
FIG. 4 shows a graph of the value of Rdson over temperature.

FIG. 4 shows a graph 400 of the value 410 of Rdson 210 over temperature, ranging from −40 degrees Celsius (° C.) to 160° C. After the values 410 of Rdson 210 over temperature are determined, a best-fit curve 420 may be calculated to obtain the temperature coefficients. The on-chip temperature sensing circuit 355 determines temperature information TAO 360 for the integrated circuit, which is a voltage and can be represented as:

$$TAO\ 360 = mx + b \quad (18)$$

where b represents the value of TAO 360 at zero degrees Celsius (C), m represents the slope in V/° C., and x represents the determined temperature of the integrated circuit in ° C. For the example best fit curve 420 of FIG. 4, TAO 360 is equal to 0.6V at 0° C., and 0.8V at room temperature, so b is equal to 0.6V, and m is equal to 8 mV/° C. For most temperatures, the first order coefficient of the best fit curve 420 is sufficient for the slope m.

TAO 360 is digitized by the ADC 365, and the resulting digital temperature information is provided to the controller 370, which adjusts the ratio of the resistance of R 280 to the resistance of R 230A based on the variation of Rdson_norm across temperature using the control signals CTL_R 230A-B 375 and CTL_R 280 380. For an N-bit ADC, the desired resistance value of R 230A can be represented as:

$$R\ 230A = (RA) + \frac{(LSB1)(2^N)(m)(T)}{Vref\ 234} \quad (19)$$

where RA represents a resistance of R 230A at zero degrees Celsius, LSB1 represents the first least significant bit of the digital temperature information from the ADC 365, and T represents the measured temperature of the integrated circuit. The resistance of R 230B is set to be equal to the resistance of R 230A.

The desired resistance value of R 280 can be represented as:

$$R\ 280 = R\_{init} - \frac{(LSB3)(2^N)(m)(T)}{Vref\ 234} \quad (20)$$

where R_init represents a resistance of R 280 at zero degrees Celsius, and LSB3 represents the third least significant bit of the digital temperature information from the ADC 365. Because Rdson_norm has a positive temperature coefficient, the ratio of R 280 to R 230A is negative, and the desired resistance of R 280 has a negative temperature coefficient. The ratio of R 280 to R 230A can be represented as:

$$\frac{R\ 280}{R\ 230A} = \quad (21)$$

$$\left(\frac{R\_{init}}{RA}\right)\left[1 - \left(\frac{(LSB3)(2^N)(m)(T)}{(Vref\ 234)(R\_{init})}\right)\right]\left[1 - \left(\frac{(LSB1)(2^N)(m)(T)}{(Vref\ 234)(RA)}\right)\right]$$

$$\frac{R\ 280}{R\ 230A} = \left(\frac{R\_{init}}{RA}\right)[1 - (X+Y)T] \quad (22)$$

where X is represented as:

$$X = \frac{(LSB3)(2^N)(m)}{(Vref\ 234)(R\_{init})} \quad (23)$$

and Y is represented as:

$$Y = \frac{(LSB1)(2^N)(m)}{(Vref\ 234)(RA)} \quad (24)$$

Figure 5:
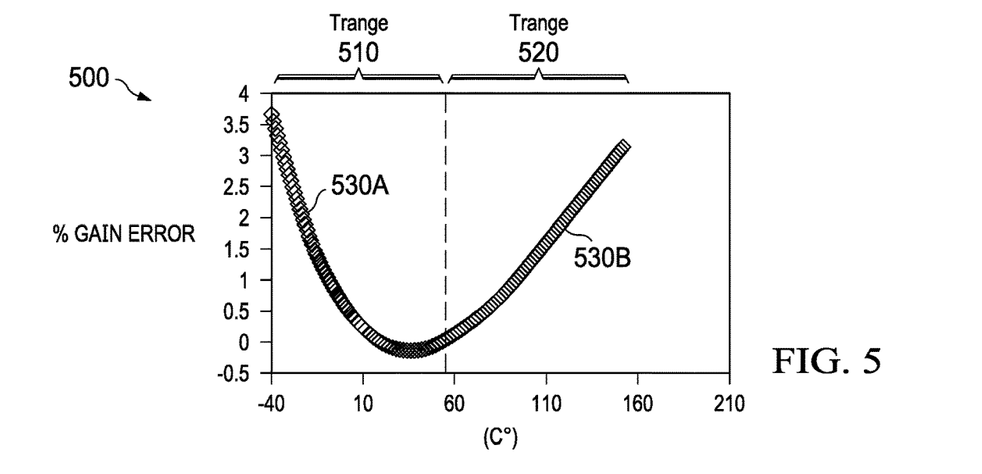
FIG. 5 shows a graph of the percent gain error over temperature for the normalized Rdson of FIG. 4.

The controller 370 adjusts the linear coefficient −(X+Y) to compensate for the positive temperature coefficient of the best fit curve 420. Although the ratio of R 280 to R 230A should compensate for variations in Rdson_norm, the current sense gain can still vary and introduce errors. FIG. 5 shows a graph 500 of the percent gain error 530 over temperature for the adjusted linear coefficient −(X+Y). The percent gain error 530 ranges from approximately 3.5% to −0.5% across approximately 200° C., from −40° C. to about 150° C. The percent gain error 530A over the first temperature range Trange 510 is nonlinear, indicating that the second order term of the best fit curve 420 dominates. The percent gain error 530B over the second temperature range Trange 520 is linear, indicating that the first order term of the best fit curve 420 dominates.

Figure 6:
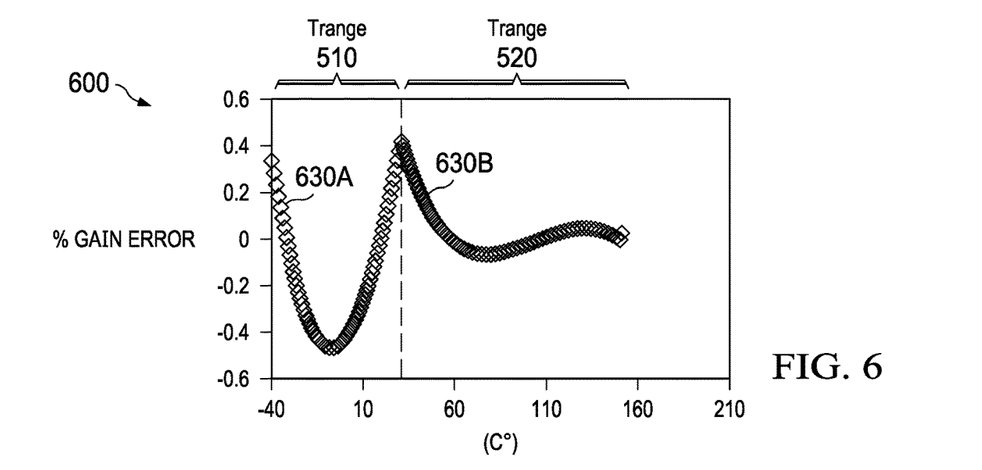
FIG. 6 shows a graph of the percent gain error over temperature for different correction factors at different temperature ranges.

The controller 370 can apply a first correction factor for the nonlinear term in Trange 510 and a second correction factor for the linear term in Trange 520. For temperatures in Trange 510, controller 370 increases the resistance of R 280 relative to R 230A. For temperatures in Trange 520, controller 370 increases the resistance of R 230A relative to R 280. FIG. 6 shows a graph of the percent gain error 630 over temperature for different correction factors at different temperature ranges. The percent gain error 630 ranges from approximately 0.5% to −0.5% across approximately 200° C., from −40° C. to about 150° C., showing the further reduction in error by using different correction factors in temperature ranges Trange 510 and Trange 520. In this implementation, the temperature range is divided into two ranges Trange 510 and Trange 520. But in other implementations, three or more temperature ranges can be used to further increase the accuracy of the gain.

The splitting of the temperature range into two or more temperature ranges and applying different correction factors to the different temperature ranges is called binning. In one example, in a particular temperature range, binning is realized by keeping resistance of one of R 230A/R 230B or R 280 fixed and varying the other. In a first example of Trange 510, the resistances of R 230A and R 230B are fixed, and the resistance of R 280 is varied. And in Trange 520 of the first example, the resistances of R 230A and R 230B are varied, and the resistance of R 280 is fixed. In a second example of Trange 510, the resistances of R 230A and R 230B are fixed to a first value, and the resistance of R 280 is varied. And in Trange 520 of the second example, the resistances of R 230A and R 230B are fixed to a second value, and the resistance of R 280 is varied. This arrangement makes the circuit 200 or the circuit 300 useful in high bandwidth applications.

Figure 7:
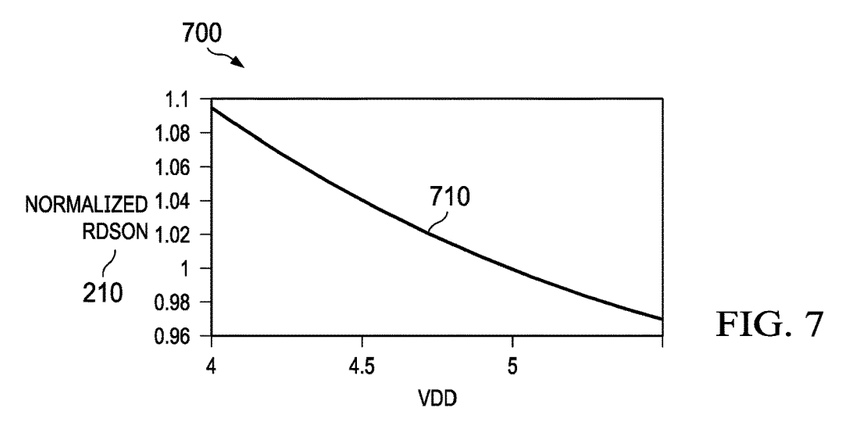
FIG. 7 shows a graph of the normalized Rdson over supply voltage.

Despite the high-accuracy of the temperature compensation, the current sensing circuit may still have errors caused by variations in Rdson 210 due to variations in the supply voltage. FIG. 7 shows a graph 700 of the normalized Rdson_norm 710 of Rdson 210 over supply voltage Vdd. The controller 370 may adjust the slope m or the offset b of the temperature information TAO 360 to compensate for supply voltage variations. For an 8-bit ADC, the 2-bit programmability for adjusting the slope m or the offset b of TAO 360 is sufficient to compensate for the smaller variation in Rdson 210 over supply voltage compared to the larger variation in Rdson 210 over temperature.

The controller 370 may trim the current mirror 250 to compensate for process variations in the Rdson 210. The output voltage VMP 275 is almost entirely independent of error, because: (a) the controller 370 compensates for variations in Rdson 210 across temperature, supply voltage and process variations; and (b) the autozeroing process with OTA 310 compensates for errors introduced by the differential amplifier offsets, inaccuracies in the current mirror 250, and the like. Controller 370 can reconstruct an output current Iout 810 of FIG. 8 to mimic the inductor current IL 125 based on VSW 215 across the low-side transistor ML and VMP 275 provided from the Rdson current sensing circuit 300 of FIG. 3.

Figure 8:
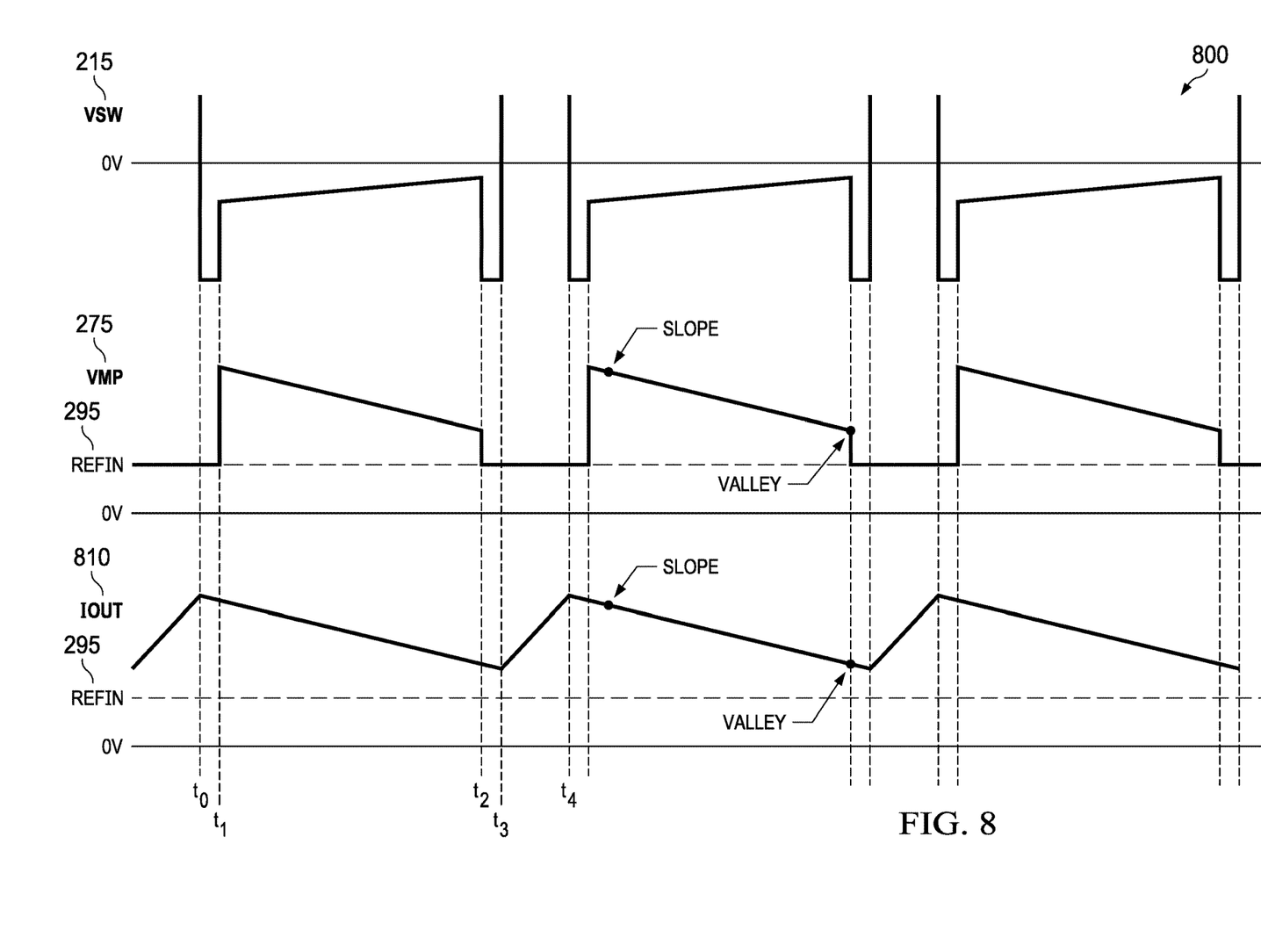
FIG. 8 shows waveforms of the output voltage, the voltage across the low-side power transistor, and the output current.

For example, controller 370 can generate Iout 810 using an amplitude locked loop and the slope and valley information of the VMP 275. The charging and discharging current within the amplitude locked loop creates a sawtooth waveform that can be compared with VMP 275. The differences in slope and valley transition points are useful to adjust the charging and discharging currents until the slope and valley transition points are aligned. The timing of Iout 810 is extracted from VSW 215.

For example, at time t0, VSW 215 transitions from above 0V to a negative supply voltage, and Iout 810 transitions from increasing to decreasing. At time t3, VSW 215 transitions from the negative supply voltage to above 0V, and Iout 810 transitions from decreasing to increasing. At time t4, VSW transitions from above 0V to the negative supply voltage, and Iout 810 transitions from increasing to decreasing. The magnitudes of the charging and discharging currents used to generate Iout 810 are adjusted to make the slope of VMP 275 between time t1 and t2 approximately equal to the slope of Iout 810 between time t0 and t3.

In this description, the term "couple" may cover connections, communications, or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C if intervening component C does not alter the functional relationship between device A and device B, so device B is controlled by device A via the control signal generated by device A.

In this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin" and "lead" are used interchangeably. Unless specifically stated to the contrary, these terms generally mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third-party.

While the use of particular transistors is described herein, other transistors (or equivalent devices) may be used instead. For example, a PFET may be used in place of an NFET with little or no changes to the circuit. Furthermore, other types of transistors may be used (such as bipolar junction transistors (BJTs)).

Circuits described herein are reconfigurable to include additional or different components to provide functionality at least partially similar to functionality available before the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same terminals. For example, a resistor or capacitor shown and described herein as a single component may instead be multiple resistors or capacitors, respectively, coupled in series between the same two terminals as the single resistor or capacitor.

Uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately" or "substantially" preceding a value means +/−10 percent of the stated value.

Modifications are possible in the described examples, and other examples are possible, within the scope of the claims.

What is claimed is:

1. A circuit comprising:
a first transistor having a first current terminal, a second current terminal, and a first control terminal;
a second transistor having a third current terminal, a fourth current terminal, and a second control terminal;
a current mirror having a first current mirror terminal, a second current mirror terminal, and a third current mirror terminal, the first current mirror terminal coupled to the second current terminal and the second current mirror terminal coupled to the fourth current terminal;
a first buffer having a first buffer input and a first buffer output, the first buffer input coupled to the third current mirror terminal;
a second buffer having a second buffer input and a second buffer output, the second buffer output coupled to the third current mirror terminal; and
a transconductance amplifier having a first amplifier input, a second amplifier input, and an amplifier output, the first amplifier input coupled to the first buffer output and the second amplifier input coupled to the second buffer output.

2. The circuit of claim 1, further comprising:
a first variable resistor having a first resistor terminal and a second resistor terminal, the second resistor terminal coupled to the first current terminal;
a second variable resistor having a third resistor terminal and a fourth resistor terminal, the fourth resistor terminal coupled to the third current terminal; and
a third variable resistor having a fifth resistor terminal and a sixth resistor terminal, the fifth resistor terminal coupled to the first buffer input and the sixth resistor terminal coupled to the second buffer output.

3. The circuit of claim 2, further comprising a controller having a controller input, a first controller output, and a second controller output, the controller input coupled to the first buffer output, the first controller output coupled to a first resistor control terminal of the first variable resistor and to a second resistor control terminal of the second variable resistor, and the second controller output coupled to a third resistor control terminal of the third variable resistor.

4. The circuit of claim 3, further comprising a temperature sensing circuit coupled to the controller, the temperature sensing circuit configured to measure a device temperature to produce a temperature indication, and the controller configured to adjust the first variable resistor, the second variable resistor, and the third variable resistor based on the temperature indication.

5. The circuit of claim 2, further comprising:
a switch having a first switch terminal, a second switch terminal, and a third switch terminal, the first switch terminal coupled to the first resistor terminal and the third switch terminal coupled to the third resistor terminal; and
a third transistor coupled to the second switch terminal.

6. The circuit of claim 1, further comprising:
a first differential amplifier having a first differential input, a second differential input, and a first differential output, the first differential input coupled to the first current terminal, the second differential input coupled to the amplifier output, and the first differential output coupled to the first control terminal; and
a second differential amplifier having a third differential input, a fourth differential input, and a second differential output, the third differential input coupled to the third current terminal and the second differential output coupled to the second control terminal.

7. The circuit of claim 6, further comprising:
a first switch having a first switch terminal and a second switch terminal, the first switch terminal coupled to the amplifier output;
a second switch having a third switch terminal and a fourth switch terminal, the third switch terminal coupled to the second switch terminal and the fourth switch terminal coupled to the second differential input; and
a third switch having a fifth switch terminal and a sixth switch terminal, the fifth switch terminal coupled to the second differential input and the sixth switch terminal coupled to the second switch terminal and to the third switch terminal.

8. The circuit of claim 1, further comprising a gain amplifier coupled between the third current mirror terminal and the first buffer input.

9. A system comprising:
a first transistor having a current terminal;
a second transistor having a first current terminal and a second current terminal, the first current terminal coupled to the current terminal of the first transistor;
an inductor having a first terminal and a second terminal, the first terminal coupled to the current terminal of the first transistor and the first current terminal of the second transistor;
a load coupled to the second terminal of the inductor and to the second terminal of the second transistor;
a third transistor having a first current terminal, a second current terminal, and a control terminal, the first current terminal coupled to the first current terminal of the second transistor;
a fourth transistor having a first current terminal, a second current terminal, and a control terminal, the first current terminal coupled to the second current terminal of the second transistor;
a current mirror having a first terminal, a second terminal, and a third terminal, the first terminal coupled to the second current terminal of the third transistor and the second terminal coupled to the second current terminal of the fourth transistor;
a first buffer having an input and an output, the input coupled to the third terminal of the current mirror;
a second buffer having an input and an output, the output of the second buffer coupled to the third terminal of the current mirror; and
a transconductance amplifier having a first input, a second input, and an output, the first input coupled to the output of the first buffer and the second input coupled to the output of the second buffer.

10. The system of claim 9, further comprising:
a first variable resistor having a first terminal and a second terminal, the first terminal coupled to the first current terminal of the third transistor and the second terminal coupled to the first current terminal of the second transistor; and
a second variable resistor having a first terminal and a second terminal, the first terminal coupled to the first current terminal of the fourth transistor and the second terminal coupled to the first terminal of the second transistor.

11. The system of claim 10, further comprising a switch having a first terminal, a second terminal, and a third terminal, the first terminal coupled to the second terminal of the first variable resistor, the second terminal coupled to the first current terminal of the second transistor, and the third terminal coupled to the second current terminal of the second variable resistor.

12. The system of claim 10, further comprising:
a controller having a first input, a second input, a first output, and a second output, the first input coupled to the output of the first buffer, the first output coupled to a control terminal of the first variable resistor, and the second output coupled to a control terminal of the second variable resistor; and
a temperature sensing circuit having an output coupled to the second input of the controller.

13. The system of claim 9, further comprising:
a variable resistor having a first terminal, a second terminal, and a control terminal, the first terminal coupled to the input of the first buffer, and the second terminal coupled to the output of the second buffer; and
a controller having an input and an output, the input coupled to the output of the first buffer and the output coupled to the control terminal of the variable resistor.

14. The system of claim 13, further comprising a temperature sensing circuit coupled to the controller.

15. A system comprising:
a first transistor having a current terminal;
a second transistor having a first current terminal and a second current terminal, the first current terminal coupled to the current terminal of the first transistor;
an inductor having a first terminal and a second terminal, the first terminal coupled to the current terminal of the first transistor and the first current terminal of the second transistor;
a third transistor having a first current terminal, a second current terminal, and a control terminal, the first current terminal coupled to the first current terminal of the second transistor;
a fourth transistor having a first current terminal, a second current terminal, and a control terminal, the first current terminal coupled to the second current terminal of the second transistor;
a current mirror having a first terminal, a second terminal, and a third terminal, the first terminal coupled to the second current terminal of the third transistor and the second terminal coupled to the second current terminal of the fourth transistor;
a first buffer having an input and an output, the input coupled to the third terminal of the current mirror;
a second buffer having an input and an output, the output of the second buffer coupled to the third terminal of the current mirror; and
a transconductance amplifier having a first input, a second input, and an output, the first input coupled to the output of the first buffer and the second input coupled to the output of the second buffer.

16. The system of claim 15, further comprising:
a first variable resistor having a first terminal and a second terminal, the first terminal coupled to the first current terminal of the third transistor and the second terminal coupled to the first current terminal of the second transistor; and
a second variable resistor having a first terminal and a second terminal, the first terminal coupled to the first current terminal of the fourth transistor and the second terminal coupled to the first terminal of the second transistor.

17. The system of claim 16, further comprising a switch having a first terminal, a second terminal, and a third terminal, the first terminal coupled to the second terminal of the first variable resistor, the second terminal coupled to the first current terminal of the second transistor, and the third terminal coupled to the second current terminal of the second variable resistor.

18. The system of claim 16, further comprising:
a controller having a first input, a second input, a first output, and a second output, the first input coupled to the output of the first buffer, the first output coupled to a control terminal of the first variable resistor, and the second output coupled to a control terminal of the second variable resistor; and
a temperature sensing circuit having an output coupled to the second input of the controller.

19. The system of claim 15, further comprising:
a variable resistor having a first terminal, a second terminal, and a control terminal, the first terminal coupled to the input of the first buffer, and the second terminal coupled to the output of the second buffer; and
a controller having an input and an output, the input coupled to the output of the first buffer and the output coupled to the control terminal of the variable resistor.

20. The system of claim 19, further comprising a temperature sensing circuit coupled to the controller.

* * * * *